United States Patent [19]

Tanaka et al.

[11] Patent Number: 5,376,898
[45] Date of Patent: Dec. 27, 1994

[54] SEMICONDUCTOR INTEGRATED CIRCUIT DEVICE

[75] Inventors: Hiroyuki Tanaka, Fuchu; Yasushi Hatta, Kodaira; Tatsuya Kouketsu, Akishima; Yasushi Takahashi, Hachiohji; Kyosuke Ishikawa, Tachikawa; Keiichi Kitamura, Kokubunji, all of Japan

[73] Assignee: Hitachi, Ltd., Tokyo, Japan

[21] Appl. No.: 38,782

[22] Filed: Mar. 29, 1993

[30] Foreign Application Priority Data

Mar. 30, 1992 [JP] Japan .................................. 4-106118

[51] Int. Cl.$^5$ ............................................. H03F 3/45
[52] U.S. Cl. ..................................... 330/253; 330/277; 330/311; 330/307
[58] Field of Search ............... 330/253, 277, 311, 307; 307/448, 443, 450, 475

[56] References Cited

U.S. PATENT DOCUMENTS 4,845,681  7/1989  Vu et al. ............................. 307/450

FOREIGN PATENT DOCUMENTS 62-188280  8/1987  Japan .

Primary Examiner—James B. Mullins
Assistant Examiner—James Dudek
Attorney, Agent, or Firm—Fay, Sharpe, Beall, Fagan, Minnich & McKee

[57] ABSTRACT

A semiconductor integrated circuit device of a type wherein loads for source follower amplifiers FETs whose gates receive an amplified signal produced from a differential amplifier section and whose each source generates an output signal, comprise first load FETs whose each gate area is small and second load FETs which are respectively series-connected with the first load FETs, whose each gate length is relatively long and each of which has small drain conductance.

21 Claims, 1 Drawing Sheet

SEMICONDUCTOR INTEGRATED CIRCUIT DEVICE

BACKGROUND OF THE INVENTION

The present invention relates to a semiconductor integrated circuit device, and to a technique suitable for use in an SCFL circuit comprised of GaAs FETs, for example.

A differential amplifier circuit called an SCFL (Source Coupled FET logic) circuit (hereinafter called merely "SCFL circuit") inclusive of both analog and digital circuits is widely used in a semiconductor integrated circuit device for light transmission, which is used with GaAs FETs (GaAs Field-Effect-Transistors and hereinafter called merely "GaAs FETs"). FIG. 2 basically shows the configuration of the SCFL circuit.

The SCFL circuit comprises a differential amplifier section and a source follower section. As shown in FIG. 2, the conventional source follower section is constructed in the form of two FETs per stage, i.e., comprises FETs Q21, Q22, Q23 and Q24 supplied with a signal from the differential amplifier section and FETs Q25, Q26, Q27 and Q28 for constant current, all of which are different in gate length from each other. Such an SCFL circuit has been disclosed in Japanese Patent Application Laid-Open Publication No. 62-188280, for example.

SUMMARY OF THE INVENTION

In order to control the gain of a source follower section and a deterioration in band thereof, it is necessary to reduce drain conductance of each FET. That is, it is necessary to reduce a level loss of a signal in the source follower section for the purpose of, with fidelity, outputting an amplified signal produced from a differential amplifier section. It is, in this case, necessary to reduce a gate-source capacitance Cgs and a gate-drain capacitance Cgd, both of which are parasitic capacitances of FETs for the purpose of improving the band of a circuit. The shortening of the gate length of each FET upon fabrication of the FET is most effective to reduce the gate-source capacitance Cgs and the gate-drain capacitance Cgd. It has however become apparent to the present inventor that a problem, i.e., a so-called short channel effect would occur according to the reduction in the gate length.

That is, problems such as a reduction in threshold voltage, an increase in a variation of the threshold voltage, etc. arise. These problems develop inconvenience to improve the performance of the circuit. As a problem on the fabrication of each FET, it is necessary to shorten the gate length while the short channel effect is being controlled. A limitation is however imposed on the shortening of the gate length. FETs each having a small gate-source capacitance Cgs and a small gate-drain capacitance Cgd are required to improve an a.c. characteristic on circuit design, whereas FETs free of the short channel effect are required to provide a stable operation in the form of d.c. Thus, the FETs, which are antipodal in property to each other, should be used.

It is an object of the present invention to provide a semiconductor integrated circuit device of a type wherein the control for the gain of a source follower section and a deterioration in band thereof, and an improvement in band of the circuit can be effected with a simple arrangement.

The above and other objects and novel features of the present invention will become apparent from the following description and the accompanying drawings.

A brief description will next be made of the summary of a typical feature of the invention disclosed in the present application. That is, a source follower section comprises, as loads for source follower amplifiers FETs whose corresponding gates receive an amplified signal produced from a differential amplifier section and whose each source produces an output signal, first load FETs whose each gate area is relatively small and second load FETs which are respectively series-connected with the first load FETs, whose each gate length is relatively long and each of which has small drain conductance.

According to the above-described means, an improvement in an a.c.-cyclic band can be made in a signal transmission path by using the first load FETs having less parasitic capacitance. Further, each drain conductance in the source follower section can be equivalently reduced by using the second load FETs whose each gate length is relatively longer than that of each first load FET. It is therefore possible to control the gain of the source follower section and a deterioration in band thereof.

BRIEF DESCRIPTION OF THE DRAWINGS

Further objects, features and advantages of the present invention become more clear from the following detailed description of a preferred embodiment, shown in the drawing wherein.

DESCRIPTION OF THE PREFERRED EMBODIMENTS

Figure 1:
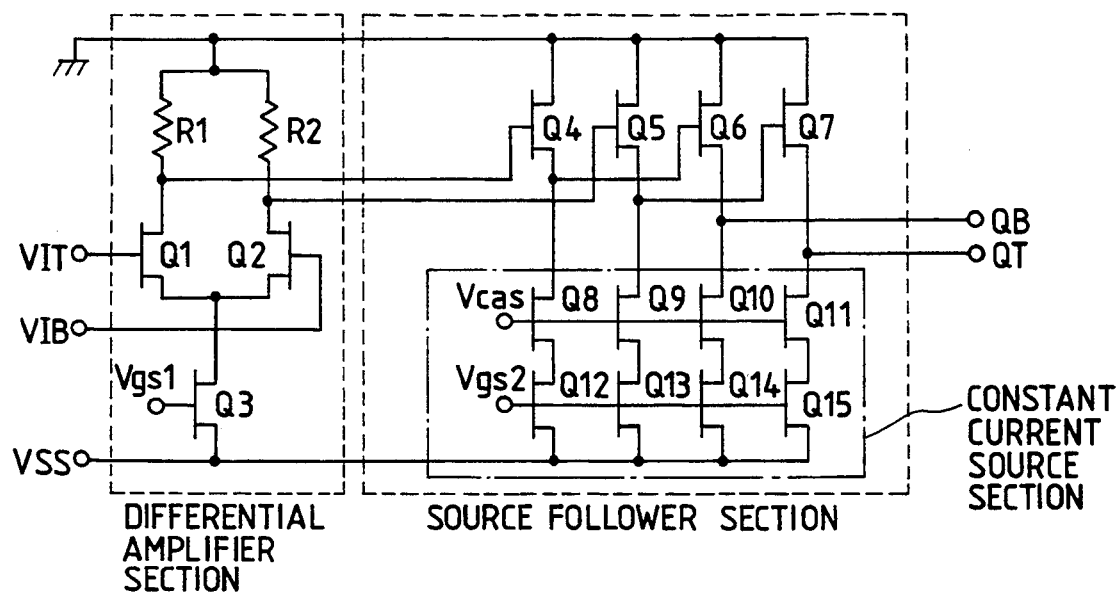
FIG. 1 is a circuit diagram showing one embodiment of an SCFL circuit according to the present invention.

FIG. 1 is a circuit diagram showing one embodiment of an SCFL circuit according to the present invention. Respective circuit elements shown in FIG. 1 are formed on a single semiconductor substrate by a technique for fabricating a known GaAa integrated circuit.

The SCFL circuit according to the present embodiment comprises a differential amplifier section and a source follower section. The differential amplifier section comprises differential FETs Q1 and Q2 which serve as a switching section, a constant current FET Q3 electrically connected to the sources of the differential FETs Q1 and Q2, and load resistances R1 and R2 electrically connected to the drains of the differential FETs Q1 and Q2 respectively. Each of the differential FETs Q1 and Q2 is set to have a gate length of about 0.3 $\mu$m. On the other hand, the FET Q3 whose gate is supplied with a constant voltage Vgs1 so as to serve as a constant current source, is set to a gate length of 1.0 $\mu$m. The constant voltage Vgs1 is supplied from an unillustrated current mirror circuit.

Source follower amplifiers FETs Q4 and Q5 whose gates receive an amplified signal outputted from the differential amplifier section, and source follower amplifiers FETs Q6 and Q7 whose gates are respectively supplied with amplified outputs of the source follower amplifiers FETs Q4 and Q5, are used for the source follower section. That is, the source follower section comprises two-stage source follower circuits arranged in tandem so as to correspond to positive-phase and negative-phase outputs produced from the differential amplifier section. A positive-phase signal output terminal QT and a negative-phase signal output terminal QB are provided so as to correspond to the positive-phase and negative-phase outputs supplied from the differential amplifier section.

Each of the source follower amplifiers FETs Q4 to Q7 is set to a short gate length such as a gate length of 0.3 μm. Since parasitic capacitances produced between the gates and sources of the respective source follower amplifiers FETs Q4 to Q7 can be reduced by using the source follower amplifiers FETs Q4 to Q7 whose gate lengths have been made short, a band characteristic of the SCFL circuit can be improved.

Figure 2:
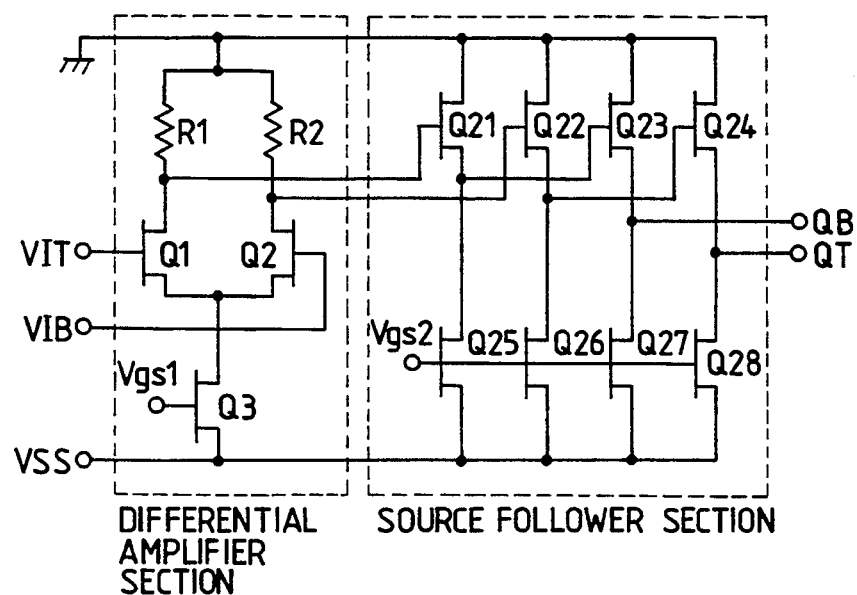
FIG. 2 is a circuit diagram illustrating one embodiment of a conventional SCFL circuit.

In a constant current source section of the source follower section, first load FETs and second load FETs are connected to one another in the form of two stages to reduce drain conductance of the constant current source section. That is, load FETs Q8 and Q12, load FETs Q9 and Q13, load FETs Q10 and Q14, and load FETs Q11 and Q15 are connected to the sources of the source follower amplifiers Q4 to Q7 respectively. The gate length of each of the load FETs Q12 to Q15 is set to a relatively long gate length such as 1.0 μm. Thus, the drain conductance can be equivalently greatly reduced. Further, the gain of the source follower section and a variation or deterioration in band thereof can be controlled as compared with a source follower section shown in FIG. 2 which has conventionally been used. Each of the gates of the load FETs Q8 to Q11 is supplied with a constant voltage Vcas, whereas each of the gates of the load FETs Q12 to Q15 is supplied with a constant voltage Vgs2. The constant voltages Vcas and Vgs2 are supplied from the unillustrated current mirror circuit.

As a result of circuit simulation which has been effected by the inventors of the present application, it has been understood that the performance in circuit, particularly its band has been affected by a gate-source capacitance Cgs of each FET for the constant current source of the source follower section and a gate-drain capacitance Cgd thereof. Therefore, the constant current source section, which serves as the load of the SCFL circuit comprised of the GaAs FETs, is made up of two kinds of two FETs whose gate lengths differ from each other. As the two kinds of FETs referred to above, there are known an FET having a gate length such as 0.3 μm, and an FET having a short-channel-effect-free gate length such as 1.0 μm, both of which have been used for the purpose of realizing a recent super broad band IC. The source follower section is constructed by using the two kinds of FETs in the following manner.

FETs whose gate lengths are small, for example, 0.3 μm, are used for the source follower amplifiers FETs Q4 to Q7 each supplied with an alternating current signal. Further, the constant current source section is constructed in two stages by cascading. FETs whose gate lengths are small, for example, 0.3 μm, are used for the upper stage, in other words, the first load FETs Q8 to Q11 respectively connected to the sources of the source follower amplifiers FETs. FETs whose gate lengths are 1.0 μm, for example, are used for the second loads FETs Q12 to Q15 corresponding to the lower stage.

In order to control the gain of the source follower section and the deterioration in the band thereof as described above, it is necessary to reduce the drain conductance of each of the FETs of the constant current source section. That is, in order to accurately output an amplified signal supplied from the differential amplifier section, it is necessary to reduce a level loss of a signal in the source follower section. In order to improve the band of the circuit on the other hand, it is necessary to reduce the gate-source capacitance Cgs of each FET and the gate-drain capacitance Cgd of each FET, both of which correspond to the parasitic capacitances. However, the two needs are contrary to each other. Nevertheless, while the gain of the source follower section and a deterioration in the band thereof are being controlled, the band of the circuit can be improved by a simple configuration that FETs whose gate lengths are short, are used for the combined two FETs connected to signal transmission paths as in this embodiment, and FETs stably operable in the form of d.c. and whose gate lengths are long, are used for FETs connected to the FETs whose gate lengths are short.

Operations and effects obtained from the above-described embodiment are as follows. That is, connected first and second load FETs are used as a load constant current source section for amplifiers FETs whose gates receive an amplified signal supplied from a differential amplifier section and whose each source produces an output signal. Therefore, the drain conductance can be reduced, thereby making it possible to control the gain of a source follower section and a deterioration in band thereof, i.e., to subject the amplified signal supplied from the differential amplifier section to power amplification with fidelity and output it.

As loads for a constant current source section for source follower amplifiers FETs whose gates receive an amplified signal supplied from a differential amplifier section and whose each source produces an output signal, first load FETs whose each gate area is small and second load FETs which are respectively series-connected with the first load FETs, whose each gate length is relatively long and each of which has small drain conductance, are used. Therefore, an improvement in an a.c.-cyclic band can be effected in a signal transmission path by using the first load FETs having less parasitic capacitance. Further, each drain conductance in a source follower section can be equivalently reduced by using the second load FETs. As a result, the gain of the source follower section and a deterioration in band thereof can be controlled.

The invention, which has been made by the present inventor, has been described specifically by the aforementioned embodiment. However, the present invention is not necessarily limited to the above embodiment. It is needless to say that many changes and modifications can be made without departing from the spirit or scope of the invention as set forth herein. For example, a differential amplifier section may comprise a single end configuration for producing either one of positive-phase and negative-phase outputs as an alternative to a double end configuration for generating both the positive-phase and negative-phase outputs. Source follower circuits are cascade-connected in two stages in the present embodiment. However, they may be configured in a single stage or may be connected in three stages or more. Constant current source loads of source follower circuits comprise respective two FETs which have been connected. However, they may comprise three or more FETs which have been cascode-connected. In this case, only FETs electrically connected to the sources of amplifiers FETs may be set to short gate lengths, whereas other FETs may be set to long gate lengths free of a short channel effect.

Similarly, the short channel effect is developed even in MOSFETs, etc. as well as in the GaAs FETs. Therefore, the respective GaAs FETs described in the present invention may use insulated gate FETs such as MOSFETs, etc.

This invention can be widely used in a semiconductor integrated circuit device including source follower circuits comprised of FETs, as well as an SCFL circuit.

A brief description will next be made of an effect obtained by a typical feature of the invention disclosed in the present application. That is, a source follower section comprises, as loads for source follower amplifiers FETs whose gates receive an amplified signal supplied from a differential amplifier section and whose each source produces an output signal, first load FETs whose each gate area is small and second load FETs which are respectively series-connected with the first load FETs, whose each gate length is relatively long and each of which has small drain conductance. Therefore, an improvement in an a.c.-cyclic band can be effected in a signal transmission path by using the first load FETs having less parasitic capacitance. Further, each drain conductance in the source follower section can be equivalently reduced by using the second load FETs. As a result, the gain of the source follower section and a deterioration in band thereof can be controlled.

What is claimed is:

1. A semiconductor integrated circuit device comprising:
   an amplifier section;
   a first amplifier FET having a source, a drain and a gate which is supplied with a first signal outputted from said amplifier section;
   a first signal output terminal electrically connected to the source of said first amplifier FET;
   a first load FET having a source, a drain and a gate, wherein one of the source and the drain thereof is coupled to the source of said first amplifier FET; and
   a second load FET having a source, a drain and a gate, wherein one of the source and the drain thereof is coupled to the other of the source and the drain of said first load FET,
   wherein a gate length of said first load FET in a direction along a channel of said first load FET is shorter than the gate length of said second load FET in a direction along a channel of said second load FET.

2. A semiconductor integrated circuit device according to claim 1, wherein said amplifier section includes a differential amplifier section, and wherein the first signal is based on a first amplified signal outputted from the differential amplifier section.

3. A semiconductor integrated circuit device according to claim 2, wherein said amplifier section further includes a first amplifier stage coupled between an output of said differential amplifier section and the gate of said first amplifier FET.

4. A semiconductor integrated circuit device according to claim 3, wherein the first amplifier stage includes:
   a second amplifier FET having a source, a drain and a gate which is supplied with the first amplified signal outputted from the differential amplifier section, wherein the source of said second amplifier FET is coupled to the gate of said first amplifier FET;
   a third load FET having a source, a drain and a gate, wherein one of the source and the drain thereof is coupled to the source of said second amplifier FET; and
   a fourth load FET having a source, a drain and a gate, wherein one of the source and the drain thereof is coupled to the other of the source and the drain of said third load FET,
   wherein a gate length of said third load FET in a direction along a channel of said third load FET is shorter than a gate length of said fourth load FET in a direction along a channel of said fourth load FET.

5. A semiconductor integrated circuit device according to claim 4, wherein gate lengths of said first and said second amplifier FETs are substantially equal to the gate lengths of said first and said third load FETs.

6. A semiconductor integrated circuit device according to claim 5, wherein the gate length of said fourth load FET is substantially equal to the gate length of said second load FET.

7. A semiconductor integrated circuit device according to claim 6, further including means for supplying the gate of each of said first and said third load FETs with a first constant voltage, and the gate of each of said second and said fourth load FETs with a second constant voltage.

8. A semiconductor integrated circuit device according to claim 7, further comprising:
   a third amplifier FET having a source, a drain and a gate which is supplied with a second amplified signal outputted from said differential amplifier section;
   a second signal output terminal electrically connected to the source of said third amplifier FET;
   a fifth load FET having a source, a drain and a gate, wherein one of the source and the drain thereof is coupled to the source of said third amplifier FET; and
   a sixth load FET having a source, a drain and a gate, wherein one of the source and the drain thereof is coupled to the other of the source and the drain of said fifth load FET, wherein a gate length of said fifth load FET in a direction along a channel of said fifth load FET is shorter than a gate length of said sixth load FET in a direction along a channel of said sixth load FET,
   said amplifier section including:
   a second amplifier stage coupled between an output of said differential amplifier section and the gate of said third amplifier FET,
   the second amplifier stage having:
   a fourth amplifier FET having a source, a drain and a gate which is supplied with the second amplified signal outputted from the differential amplifier section, wherein the source of said fourth amplifier FET is coupled to the gate of said third amplifier FET;
   a seventh load FET having a source, a drain and a gate, wherein one of the source and the drain thereof is coupled to the source of said fourth amplifier FET; and
   an eighth load FET having a source, a drain and a gate, wherein one of the source and the drain thereof is coupled to the other of the source and the drain of said seventh load FET, wherein a gate length of said seventh load FET in a direction along a channel of said seventh load FET is shorter than a gate length of said eighth load FET in a direction along a channel of said eighth load FET.

9. A semiconductor integrated circuit device according to claim 8, wherein said first and said second amplified signals are complementary signals with respect to each other.

10. A semiconductor integrated circuit device according to claim 9, wherein gate lengths of said third and said fourth amplifier FETs are substantially equal to the gate lengths of said fifth and said seventh load FETs.

11. A semiconductor integrated circuit device according to claim 10, wherein the gate length of said eighth load FET is substantially equal to the gate length of said sixth load FET.

12. A semiconductor integrated circuit device according to claim 11, wherein said means supplies the gate of each of said fifth and said seventh load FETs with the first constant voltage, and the gate of each of said sixth and said eighth load FET with the second constant voltage.

13. A semiconductor integrated circuit device according to claim 12, wherein all said FETs are GaAs FETs.

14. A semiconductor integrated circuit device according to claim 13, wherein said semiconductor integrated circuit device is a SCFL circuit.

15. A semiconductor integrated circuit device comprising:
 a differential amplifier section;
 a first amplifier FET having a source, a drain and a gate which is supplied with a first signal on the basis of a first amplified signal outputted from said differential amplifier section;
 a first signal output terminal electrically connected to the source of said first amplifier FET;
 a first load FET having a source, a drain and a gate, wherein one of the source and the drain thereof is coupled to the source of said first amplifier FET;
 a second load FET having a source, a drain and a gate, wherein one of the source and the drain thereof is coupled to the other of the source and the drain of said first load FET;
 a second amplifier FET having a source, a drain and a gate which is supplied with a second signal on the basis of a second amplified signal outputted from said differential amplifier section;
 a second signal output terminal electrically connected to the source of said second amplifier FET;
 a third load FET having a source, a drain and a gate, wherein one of the source and the drain thereof is coupled to the source of said second amplifier FET; and
 a fourth load FET having a source, a drain and a gate, wherein one of the source and the drain thereof is coupled to the other of the source and the drain of said third load FET,
 wherein a gate area of said first load FET is smaller than that of said second load FET; and wherein a gate area of said third load FET is smaller than that of said fourth load FET.

16. A semiconductor integrated circuit device according to claim 15, further comprising:
 an amplifier stage coupled between outputs of said differential amplifier section and the gates of said first and said second amplifier FETs;
 said amplifier stage including:
  a third amplifier FET having a source, a drain and a gate which is supplied with the first amplified signal outputted from said differential amplifier section wherein the source of said third amplifier FET is coupled to the gate of said first amplifier FET;
  a fifth load FET having a source, a drain and a gate, wherein one of the source and the drain thereof is coupled to the source of said third amplifier FET;
  a sixth load FET having a source, a drain and a gate, wherein one of the source and the drain thereof is coupled to the other of the source and the drain of said fifth load FET;
  a fourth amplifier FET having a source, a drain and a gate which is supplied with the second amplified signal outputted from said differential amplifier section, wherein the source of said fourth amplifier FET is coupled to the gate of said second amplifier FET;
  a seventh load FET having a source, a drain and a gate, wherein one of the source and the drain thereof is coupled to the source of said fourth amplifier FET;
  an eighth load FET having a source, a drain and a gate, wherein one of the source and the drain thereof is coupled to the other of the source and the drain of said seventh load FET;
  wherein a gate area of said fifth load FET is smaller than that of said sixth load FET; and
  wherein a gate area of said seventh load FET is smaller than that of said eighth load FET.

17. A semiconductor integrated circuit device according to claim 16, wherein the gate area of each said first, said second, said third and said fourth amplifier FETs is substantially equal to the gate area of each said first, said third, said fifth and said seventh load FETs.

18. A semiconductor integrated circuit device according to claim 17, wherein the gate area of said second load FET is substantially equal to the gate area of each said fourth, said sixth and said eighth load FETs.

19. A semiconductor integrated circuit device according to claim 18, wherein all said FETs are GaAs FETs.

20. A semiconductor integrated circuit device according to claim 19, further including means supplying the gate of each of said first, said third, said fifth and said seventh load FETs with a first constant voltage, and the gate of each of said second, said fourth, said sixth and said eighth load FETs with a second constant voltage.

21. A semiconductor integrated circuit device according to claim 20, wherein said semiconductor integrated circuit device is a SCFL circuit.

* * * * *